United States Patent
Blair et al.

(10) Patent No.: US 7,518,448 B1
(45) Date of Patent: Apr. 14, 2009

(54) AMPLIFIER MODE SWITCH

(75) Inventors: Darren Blair, Airdrie (CA); Nigel Johnson, Calgary (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 40 days.

(21) Appl. No.: 11/535,953

(22) Filed: Sep. 27, 2006

(51) Int. Cl.
  *H03F 3/68* (2006.01)
(52) U.S. Cl. .................................... 330/124 R; 330/51
(58) Field of Classification Search ............ 330/124 R, 330/295, 296, 285–286
See application file for complete search history.

(56) References Cited

U.S. PATENT DOCUMENTS

| | | | | |
|---|---|---|---|---|
| 5,757,229 A | * | 5/1998 | Mitzlaff | .................. 330/124 R |
| 6,496,061 B1 | * | 12/2002 | Bloom et al. | .................. 330/51 |
| 6,731,173 B1 | * | 5/2004 | Thompson | .................. 330/296 |
| 7,135,931 B2 | * | 11/2006 | Prodanov | .................... 330/302 |
| 2007/0139105 A1 | * | 6/2007 | Kennan | .................. 330/124 R |

* cited by examiner

*Primary Examiner*—Robert Pascal
*Assistant Examiner*—Hieu P Nguyen
(74) *Attorney, Agent, or Firm*—Schwegman, Lundberg & Woessner, P.A.

(57) ABSTRACT

A power amplifier includes a main amplifier having a first output. An auxiliary amplifier has a second output coupled to the first output. A splitter splits a RF input into a first input provided to the main amplifier and a second input delayed by one/quarter wavelength provided to the auxiliary amplifier. A bias control is coupled to the auxiliary amplifier for controllably switching operation of the power amplifier between two different modes of operation.

20 Claims, 2 Drawing Sheets

AMPLIFIER MODE SWITCH

BACKGROUND

Power amplifiers are used in radio base station products for cellular telephone networks such as CDMA and OFDM. They may also be used in other wireless networks, such as WiMax and others, and provide amplification of microwave and radio frequency signals for transmission. Several different configurations of operation of power amplifiers have been used. A first traditional configuration is referred to as a conventional 2-way combined class AB mode. In this configuration, a pair of amplifiers are both operating to amplify one half of the signal to be transmitted. A higher efficiency configuration is referred to as a 2-way Doherty configuration. In this configuration, two transistor stages are combined. One stage is a main amplifier, and the other is an auxiliary amplifier. At low power levels, the auxiliary amplifier is operating in a cutoff mode, and does not significantly contribute to the output. At higher power levels, the auxiliary amplifier contributes to the output, and moves toward equal contribution at the highest power levels.

The conventional configuration provides lower efficiency, but also lower electrical memory effects. This requires a less sophisticated predistortion linearization algorithm to meet conducted spurious emissions requirements. The higher efficiency Doherty configuration exhibits much higher electrical memory effects, and thus requires a much more sophisticated predistortion linearization algorithm with memory correction.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Figure 1:
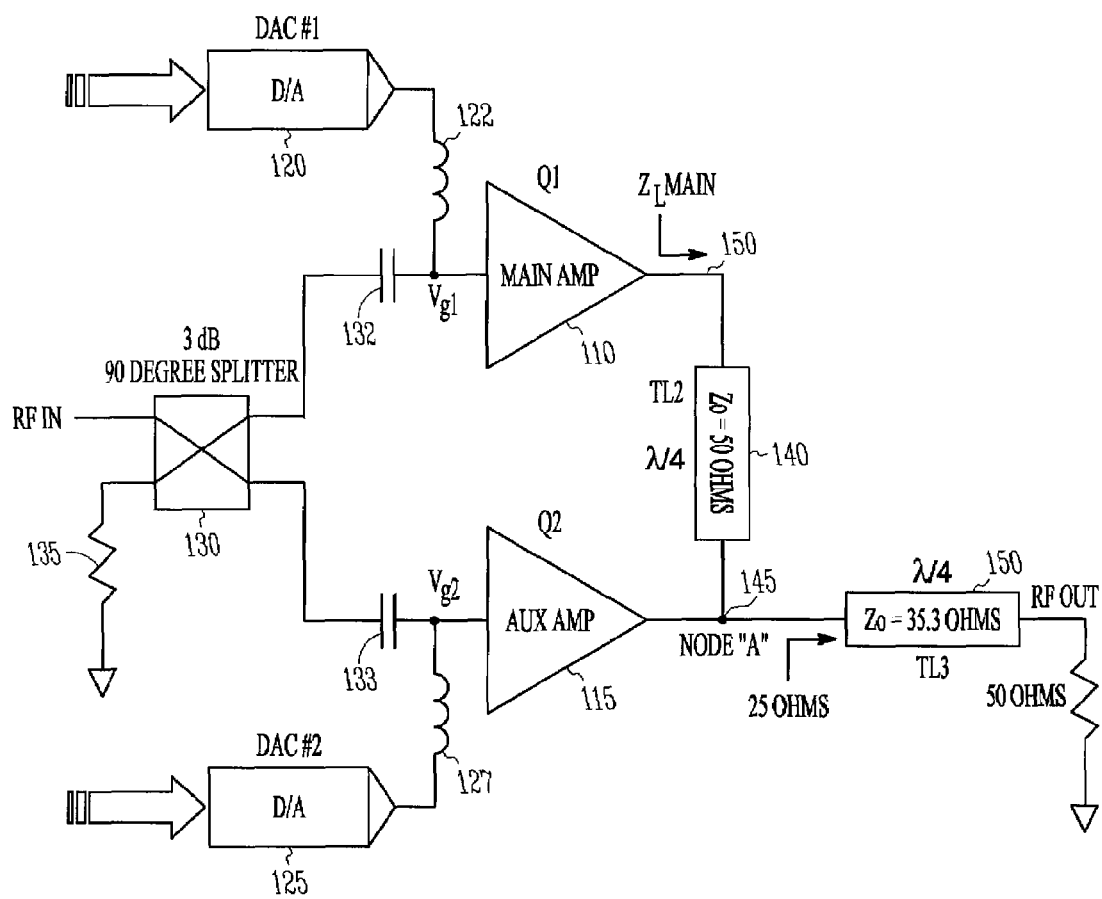
FIG. 1 is a block circuit diagram of a power amplifier according to an example embodiment.

An amplifier configuration 100 in FIG. 1 is controllable to operate in two different modes, a Doherty mode, and a balanced class AB mode. Amplifier configuration 100 includes a main amplifier 110 and an auxiliary amplifier 115. In one embodiment, the amplifiers are power amplifiers that may be used to amplify microwave and RF signals for transmission. Example amplifiers include CDMA amplifiers, but may also be amplifiers that may be used in various modulation schemes, such as UMTS, WCDMA, WiMax and OFDM standards to name a few.

In one embodiment, the amplifiers are symmetric in that both have substantially the same area and response characteristics. In further embodiments, the amplifiers need not be symmetric. Main amplifier 110 is biased by a DC signal provided by a programmable digital to analog converter DAC 120. The DAC 120 dc signal is provided to main amplifier 110 through an AC blocking inductor 122.

Auxiliary amplifier 115 is biased by a DC signal provided by a programmable digital to analog converter DAC 125. The DAC 125 DC signal is provided to main amplifier 115 through an AC blocking inductor 127. The DC signals from DACs 120, 125 operate to control the bias of the respective amplifiers 110, 115, and hence their mode of operation. In normal operation, the DACs 120, 125 may be used to introduce corrections for temperature based and other drift. While DACs are used, any other type of circuitry may be used to provide a DC bias signal to the inputs of the amplifiers 110, 115.

An RF input signal is provided to a splitter 130. In one embodiment, the splitter is a 3 dB 90 degree Splitter. It operates to split the input, which may be RF or other frequency based signal, and provide substantially equal amplitude inputs to the main amplifier 110 and auxiliary amplifier 115. The phase of the signal delivered to auxiliary amplifier 115 is delayed by 90 degrees. The inputs to the amplifiers are provided through DC blocking circuitry, such as capacitors 132, 133 respectively.

In a further embodiment, a 3 dB 0 degree splitter with an addition ¼ wave (90 degree) transmission line to the auxiliary amplifier 115 may be used to provide the 90 degree delay. Further alternatives that provide desired splitting and delay functions may also be used.

Splitter 130 in one embodiment is coupled to ground through a resistor 135, which may provide a termination for reflections, provided the reflection coefficient in the two arms to the amplifiers is substantially the same. Splitter 130 also provides a one quarter wavelength delay in the input signal to auxiliary amplifier 115. In one embodiment, the delay is provided to match a delay provided by a transmission line 140 encountered by the output of main amplifier 110 prior to combining of the outputs of both amplifiers at a node A at 145. The combined output is provided through a quarter wavelength transformer 150 for transmission, such as via an antenna. Transmission lines 140, and 150, and node 145 are referred to as a Doherty combining network.

In a typical symmetric Doherty configuration, both amplifiers are the same size and the main amplifier 110 is biased in Class AB mode while the auxiliary amplifier 115 is biased in Class C mode. This is accomplished by setting the DC gate voltage for each stage, via the DACs 120, 125 to obtain the desired quiescent drain current. In one embodiment, the DC gate voltage provided by DAC 125 is about ½ that of the DC gate voltage provided by DAC 120 to main amplifier 110.

Doherty operation is best understood by examining operation at low and high RF output power levels. For this example, both the Main Amp and the Aux Amp are designed to deliver maximum power into a 50 ohm load.

Figure 2:
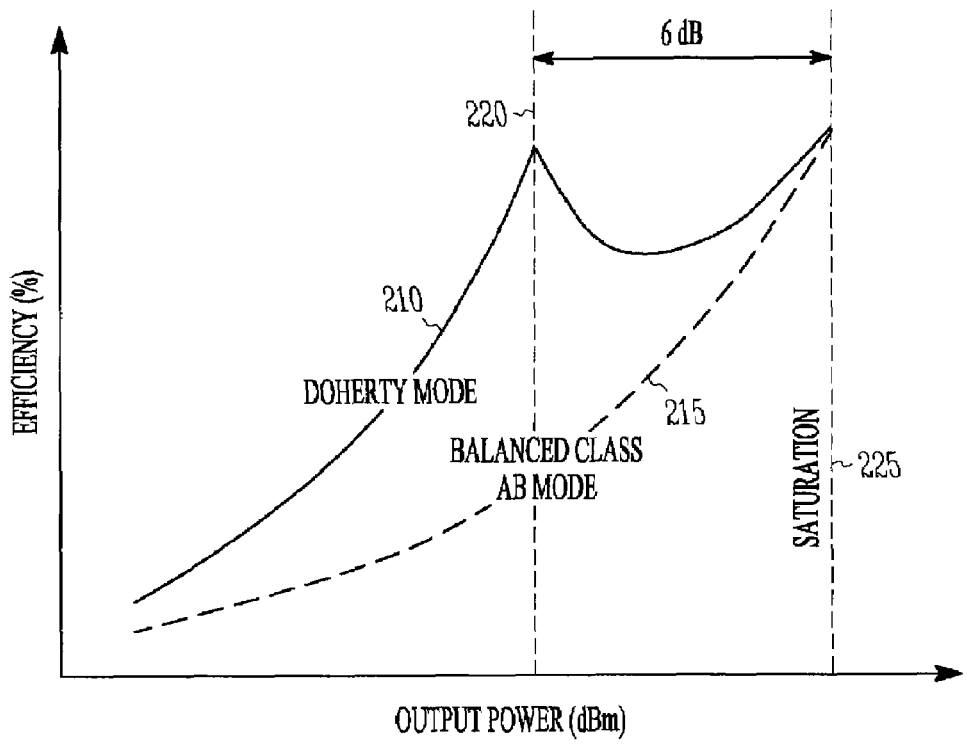
FIG. 2 is a graph of amplifier efficiency versus output power for two different modes of operation of the power amplifier of FIG. 1 according to an example embodiment.

At low RF power levels, the auxiliary amplifier 115 is in cutoff and delivers no current to Node "A" 145. Hence, the impedance presented to bottom end of the 50 ohm ¼ transmission line represented by transmission line 140, is 25 ohms and the impedance, RLmain at 155, looking into the top end of transmission line 140, is 100 ohms. Due to the 100 ohm load on the main amplifier 110, the main amplifier loadline is doubled and the efficiency of the main amplifier 110 device is also doubled. In addition, since the auxiliary amplifier 115 is in cutoff, it draws no drain current and the efficiency is further improved. The solid curve 210 in FIG. 2 shows the typical shape of efficiency curve for a symmetric Doherty architecture.

At high power levels, the auxiliary amplifier 115 injects current into node "A" 145 in phase with the current from the main amplifier 110. When the current contributions from the stages are equal, the impedance presented to the bottom end of impedance 140 is no longer 25 ohms but is increased to 50 ohms through the "load-pulling" effect of the Aux amp. The impedance, RL main at 150, is correspondingly decreased from 100 ohms to 50 ohms. Due to the 50 ohm load on the main amplifier 110, the loadline is returned to the nominal matching condition for the device and the Psat is maximized. In this regime, both the main and auxiliary amplifiers are operating into nominal 50 ohms loads and peak power operation is similar to that of a conventionally combined, balanced Class AB configuration.

In one embodiment, the DC bias provided by DAC 125 to auxiliary amplifier 115 may be increased to control the power amplifier 100 to respond as a balanced class AB configuration. This may be done by controlling the DAC 125 to provide the same bias as that provided by DAC 120 to main amplifier 110. The control may be provided by software, allowing a user, or manufacturer to utilize the same circuit for two different modes of operation.

In a further embodiment, the power amplifier configuration is changed from operating in a Doherty mode to a balanced mode at a desired threshold, which may be predetermined. By increasing the gate bias voltage for the auxiliary amplifier when the threshold is reached from below the threshold, a balanced mode of operation is achieved dynamically. If the Aux amp gate bias voltage is increased until the quiescent drain current (Idq) of the Aux amp equals that of the Main amp, a mode of operation is achieved which is very similar to a conventionally combined, balanced Class AB structure. The broken curve 215 in FIG. 2 shows how the efficiency of this mode over all power levels typically compares to that of Doherty mode over all power levels represented by curve 210. The curves in FIG. 2 correspond to static operation of the power amplifier in the two different modes, balanced and Doherty.

In one embodiment, the threshold may be set as illustrated at 220 such that the power amplifier configuration operates in balanced mode for 6 dB backed off from saturation at 225. Note that FIG. 2 does not show the resulting curve illustrating use of the threshold to switch modes. When the power decreases below the threshold, the bias provided by DAC 125 may be lowered to control the power amplifier configuration back into a Doherty mode.

In further embodiments, the threshold may be varied dynamically without regard to the 6 dB threshold as desired to provide different tradeoffs between efficiency and complexity, and may be set by circuitry, or may be software controlled in various embodiments. Dynamically changing the bias point of the auxiliary or main amplifier as a function of the input power level may provide yet a further mode of operation which results provides further such tradeoffs.

Figure 3:
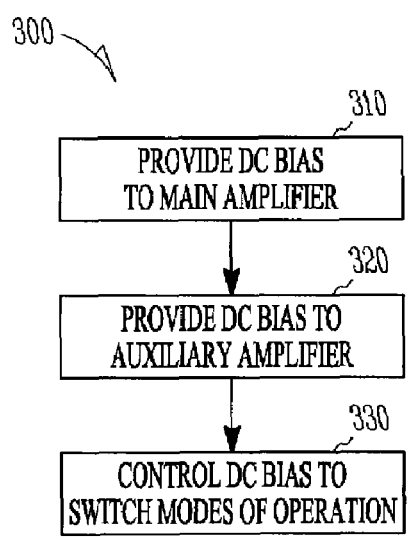
FIG. 3 is a flowchart illustrating switching a power amplifier between two modes of operation according to an example embodiment.

FIG. 3 is a flowchart illustrating a method 300 of switching modes of operation of a power amplifier. At 310, a DC bias is provided to a main amplifier having a first output. At 320, a DC bias is provided to an auxiliary amplifier having a second output coupled to the first output. At 330, DC bias provided to the auxiliary amplifier is controlled to controllably switch modes of operation of the power amplifier between a balanced mode of operation and a Doherty mode of operation. In one embodiment, the mode is selected for operation of the power amplifier at all power levels, such as at the factory, or may be switchable by a software key in the field, allowing two versions with two different price levels if desired. In a further embodiment, the modes are controlled as a function of a power threshold which may be approximately 6 dB before saturation of the auxiliary amplifier. In one embodiment the power amplifier is controlled to operate in a Doherty mode when the power is below the threshold, and to operate in a balanced mode when the power is above the threshold.

In one embodiment, the mode switching may be accomplished quickly by varying the output of the DAC 125 in response to high speed variations in output power, such as in the 10 to 15 MHz. range. In various embodiments, one version of hardware may be deployed to provide two different modes of operation. The modes may be fixed, changeable such as by use of a software key, or varied dynamically by controlling the bias of the auxiliary amplifier 15. The power amplifier 100 is applicable to many different bandwidth modulation schemes, including wide bandwidth modulation schemes. As described above, dynamically changing the bias point of the amplifiers may provide yet a further mode of operation. A continuously variable voltage on the auxiliary amplifier bias in response to input power level would allow efficiency to be traded off against peak power continuously across the power range.

The Abstract is provided to comply with 37 C.F.R. § 1.72(b) to allow the reader to quickly ascertain the nature and gist of the technical disclosure. The Abstract is submitted with the understanding that it will not be used to interpret or limit the scope or meaning of the claims.

The invention claimed is:

1. A power amplifier comprising:
a main amplifier having an output coupled to a Doherty combining network;
an auxiliary amplifier having an output coupled to the Doherty combining network;
a splitter that splits a RF input into a first input provided to the main amplifier and a second input delayed by one/quarter wavelength provided to the auxiliary amplifier; and
a bias control coupled to the auxiliary amplifier for controllably switching operation of the power amplifier between a balanced class AB mode of operation and a Doherty mode of operation.

2. The power amplifier of claim 1 wherein the Doherty combining network comprises a first one quarter wavelength delay coupled to the output of the main amplifier.

3. The power amplifier of claim 1 wherein the bias control comprises a digital to analog converter coupled to an AC blocking circuit.

4. The power amplifier of claim 3 wherein the bias control provides a first bias for operation of the power amplifier in the Doherty mode and a second bias for operation of the power amplifier in the balanced mode.

5. The power amplifier of claim 4 wherein the bias control is controlled to provide the first bias below a power threshold and the second bias above the power threshold.

6. The power amplifier of claim 5 wherein the power threshold is approximately 6 dB short of saturation mode of the auxiliary amplifier.

7. The power amplifier of claim 4 wherein the bias control is set by software to one or the other of the first and second biases.

8. The power amplifier of claim 3 wherein the bias may be varied continuously between a value that provides operation in the balanced mode of operation and a value that provides operation in the Doherty mode of operation.

9. The power amplifier of claim 1 and further comprising a second bias control coupled to the main amplifier.

10. The power amplifier of claim 9 wherein the second bias control biases the main amplifier in AB mode, and wherein the main amplifier and auxiliary amplifier are approximately the same size.

11. A power amplifier comprising:
a main amplifier having a first output;
an auxiliary amplifier having a second output coupled to the first output;
a splitter that splits a RF input into a first input provided to the main amplifier and a second input provided to the auxiliary amplifier; and
means for controllably switching operation of the power amplifier between a balanced class AB mode of operation and a Doherty mode of operation.

12. The power amplifier of claim 11 wherein the splitter comprises a 3 dB 90 degree splitter.

13. The power amplifier of claim 12 wherein first and second inputs provided by the splitter are coupled to the main amplifier and auxiliary amplifiers through DC blocking capacitors.

14. The power amplifier of claim 13 wherein the means for controllably switching operation of the power amplifier comprises a digital to analog converter under software control to provide two different bias levels to the auxiliary amplifier.

15. A method of switching modes of operation of a power amplifier, the method comprising:
providing a DC bias to a main amplifier having a first output;
providing a DC bias to an auxiliary amplifier having a second output coupled to the first output; and
controlling the DC bias provided to the auxiliary amplifier to controllably switch modes of operation of the power amplifier between a balanced class AB mode of operation and a Doherty mode of operation.

16. The method of claim 15 wherein a mode is selected for operation of the power amplifier at all power levels.

17. The method of claim 15 wherein the modes are controlled as a function of a power threshold.

18. The method of claim 17 wherein the power threshold is approximately 6 dB before saturation of the auxiliary amplifier.

19. The method of claim 17 wherein the power amplifier is controlled to operate in a Doherty mode when the power is below the threshold, and to operate in a balanced mode when the power is above the threshold.

20. The method of claim 15 and further comprising splitting an RF input signal into a first input signal for the main amplifier and a second input signal delayed one quarter wavelength for the auxiliary amplifier.

\* \* \* \* \*